United States Patent
Das

(10) Patent No.: US 7,831,943 B1
(45) Date of Patent: Nov. 9, 2010

(54) CHECKING FOR VALID SLICE PACKING IN A PROGRAMMABLE DEVICE

(75) Inventor: Satyaki Das, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 782 days.

(21) Appl. No.: 11/787,600

(22) Filed: Apr. 16, 2007

(51) Int. Cl.
G06F 17/50 (2006.01)
(52) U.S. Cl. .......................................... 716/5; 716/16
(58) Field of Classification Search .................. 716/1, 716/4–5, 16–18
See application file for complete search history.

(56) References Cited

U.S. PATENT DOCUMENTS 7,028,281 B1 * 4/2006 Agrawal et al. ............... 716/12

OTHER PUBLICATIONS

R. G. Wood and R. A. Rutenbar, "*FPGA routing and routability estimation via Boolean satisfiability*," IEEE Trans. VLSI Syst., vol. 16, pp. 222-231, Jun. 1998.

\* cited by examiner

*Primary Examiner*—Paul Dinh
(74) *Attorney, Agent, or Firm*—Kevin T. Cuenot; Thomas George

(57) ABSTRACT

A method of determining validity of slice packing for a programmable device can include identifying a slice topology for a slice, identifying a circuit fragment assigned to the slice, and generating a set of Boolean equations describing conditions for mapping the circuit fragment to the slice according to the slice topology. The method further can include determining whether a solution to the set of Boolean equations exists and indicating whether the slice is validly packed according to whether a solution for the set of Boolean equations is determined.

19 Claims, 2 Drawing Sheets

CHECKING FOR VALID SLICE PACKING IN A PROGRAMMABLE DEVICE

BACKGROUND

Circuit designs that are to be implemented as an integrated circuit (IC) typically are specified using a hardware description language. When implementing an HDL circuit description on a programmable logic device (PLD), the circuit description must undergo several different stages of processing. With respect to a field programmable gate array (FPGA) type of PLD, for example, the circuit design must be mapped onto the FPGA device. That is, circuit elements from the circuit description must be assigned to available components or sites on the target device.

One aspect of mapping is packing different circuit elements into slices. In general, an FPGA includes a large number of configurable logic blocks (CLBs). Each CLB can include a plurality of slices. The different elements of a circuit design, for example, lookup tables (LUTs), flip flops, multiplexers, routing resources, etc., must be assigned to the available slices in the target device.

When packing circuit elements into slices, it is desirable to include elements that are connected together in the circuit design into the same slice. This can reduce wire lengths in the resulting circuit implementation and reduce, if not avoid, routing congestion. Packing circuit elements into slices can be modeled as a clustering problem. Typically, heuristics are used by the implementation tools to determine which circuit elements will be clustered together and placed into a slice.

Once these "clusters" are formed, further analysis must be performed to ensure that each cluster actually fits within a slice. While functions are available within development tools to perform slice validity checking, these tools are complex to develop. Debugging, therefore, also is difficult. Making matters worse, a custom-coded solution must be developed for each different type of slice topology, or architecture, that is made available in a target device.

BRIEF SUMMARY OF THE INVENTION

The present invention is directed to determining slice packing validity. One embodiment of the present invention can include a method of determining validity of slice packing for a programmable logic device (PLD). The method can include identifying a slice topology for a slice of a PLD and identifying a circuit fragment assigned to the slice. A set of Boolean equations describing conditions for mapping the circuit fragment to the slice can be generated according to the slice topology. A determination can be made as to whether a solution to the set of Boolean equations exists. An indication can be provided as to whether the slice is validly packed according to whether a solution is determined for the set of Boolean equations.

Another embodiment of the present invention can include a method of determining validity of slice packing for a PLD including identifying a slice topology for a slice and a plurality of circuit elements assigned to the slice, generating a set of Boolean constraints that enforces the slice topology when mapping the plurality of circuit elements to the slice, and indicating whether the slice is validly packed according to whether a solution is found for the set of Boolean constraints.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The present invention relates to synthesis of circuit designs using programmable logic devices (PLDs). More particularly, the present invention relates to determining whether a given slice packing, for example, for a field programmable gate array (FPGA) device, is valid. A topology for available slices in a target device, e.g., an FPGA, can be provided. For example, a Virtex™-5 type of FPGA available from Xilinx®, Inc. of San Jose, Calif. includes two slices within each CLB. (Xilinx and Virtex are trademarks of Xilinx, Inc. in the United States, other countries, or both). A portion of a circuit design, referred to herein as a circuit fragment, that has been assigned to a slice having the known slice topology also can be identified.

A plurality of constraints can be generated automatically that specify conditions for implementing the circuit fragment within the slice. These constraints can be provided to a solver. If a solution is determined that satisfies each of the generated constraints, the slice packing is considered valid. If a solution cannot be determined or does not exist, the slice packing is considered to be invalid and the circuit fragment cannot be implemented within the slice.

Figure 1:
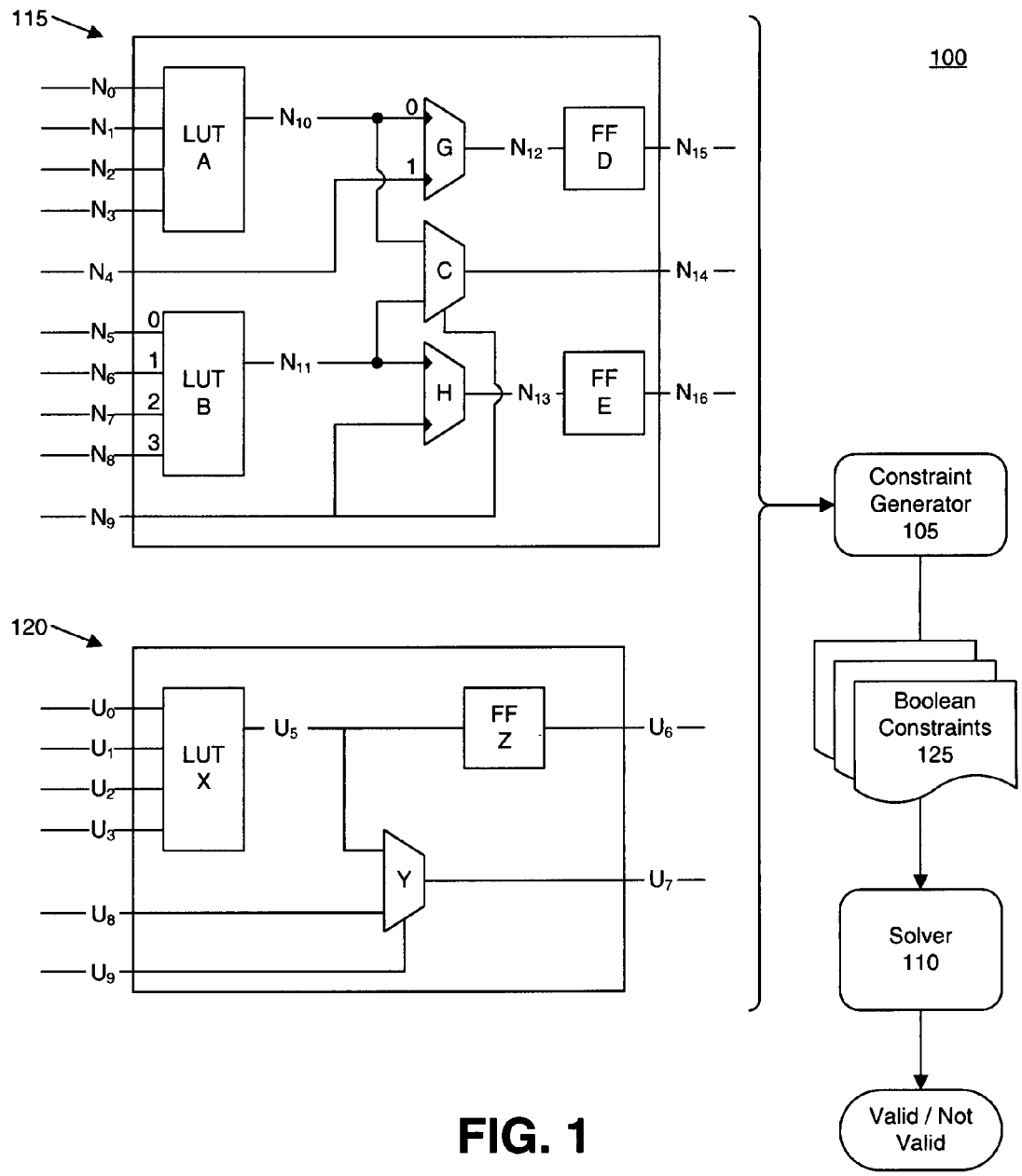
FIG. 1 is a block diagram illustrating a system for determining slice packing validity for a programmable logic device (PLD) in accordance with one embodiment of the present invention.

FIG. 1 is a block diagram illustrating a system 100 for determining slice packing validity for a PLD in accordance with one embodiment of the present invention. The system can include a constraint generator 105 and a solver 110. Inputs to the constraint generator 105 can include a slice topology 115 corresponding to available slices in the target PLD and a circuit fragment 120 that is to be implemented in the slice.

The slice topology 115 indicates the available circuit elements within the slice to which circuit elements from the circuit fragment 120 can be mapped. The slice topology 115 further specifies connectivity among the slice elements. The circuit fragment 120 specifies a plurality of circuit elements that have been assigned to a slice of a target device that conforms to the slice topology 115. For example, the circuit fragment 120 can be a portion of a larger user-specified circuit design. In any case, the circuit elements of the circuit fragment 120 can be assigned to the slice using a mapping or other synthesis tool.

As used herein, the term "element" or "circuit element" is intended to refer to both components and routing resources. That is, a circuit element can be any object within a circuit fragment that must be mapped to the slice. A "component", as used herein, can refer to structures such as lookup tables (LUTs), multiplexers, flip-flops, or the like. A "routing resource", "wiring resource", "net", or simply "wire", can include any structure that can propagate signals between and/or among the components. In this regard, it can be seen that the circuit fragment 120 includes one LUT X, one multiplexer Y, one flip-flop Z, and a plurality of signals $U_0$-$U_9$. The slice topology 115 includes two LUTs A and B, two flip-flops D and E, three multiplexers C, G, and H, as well as a plurality of available nets $N_0$-$N_{16}$. It should be appreciated that circuit components from the circuit fragment 120 cannot be mapped to the multiplexers G and H as these components of the slice topology 115 are present to increase routing flexibility.

The constraint generator 105 takes the slice topology 115 and the circuit fragment 120 as input and generates a plurality of Boolean constraints 125. The Boolean constraints 125 are a series of Boolean equations that specify conditions that must be observed to implement the circuit fragment 120 within a slice specified by the slice topology 115. The Boolean constraints 125 can be provided to the solver 110. The solver 110 can attempt to solve the set of Boolean constraints 125.

If the solver is able to determine a solution for the Boolean constraints 125, the solver 110 can indicate that the slice packing is valid. That is, if a solution is found, the set of circuit elements of circuit fragment 120 can be implemented within the slice. If no solution can be determined by the solver 110 for the set of Boolean constraints 125, the solver 110 can indicate that the slice packing is not valid, i.e., the circuit fragment 120 cannot be implemented in a slice that conforms to the slice topology 115.

In one embodiment, the solver 110 can be implemented as a SAT-solver. A SAT solver is a Boolean satisfiability problem solver. Such applications are known in the art and commercially available. Any of a variety of different SAT-solvers can be used and the embodiments disclosed herein are not intended to be limited by the particular type of SAT-solver that is selected. In general, a SAT-solver determines whether, given a set of Boolean equations, there exists a set of values for the variables of the equations that will make the entire expression, or set of expressions true.

Figure 2:
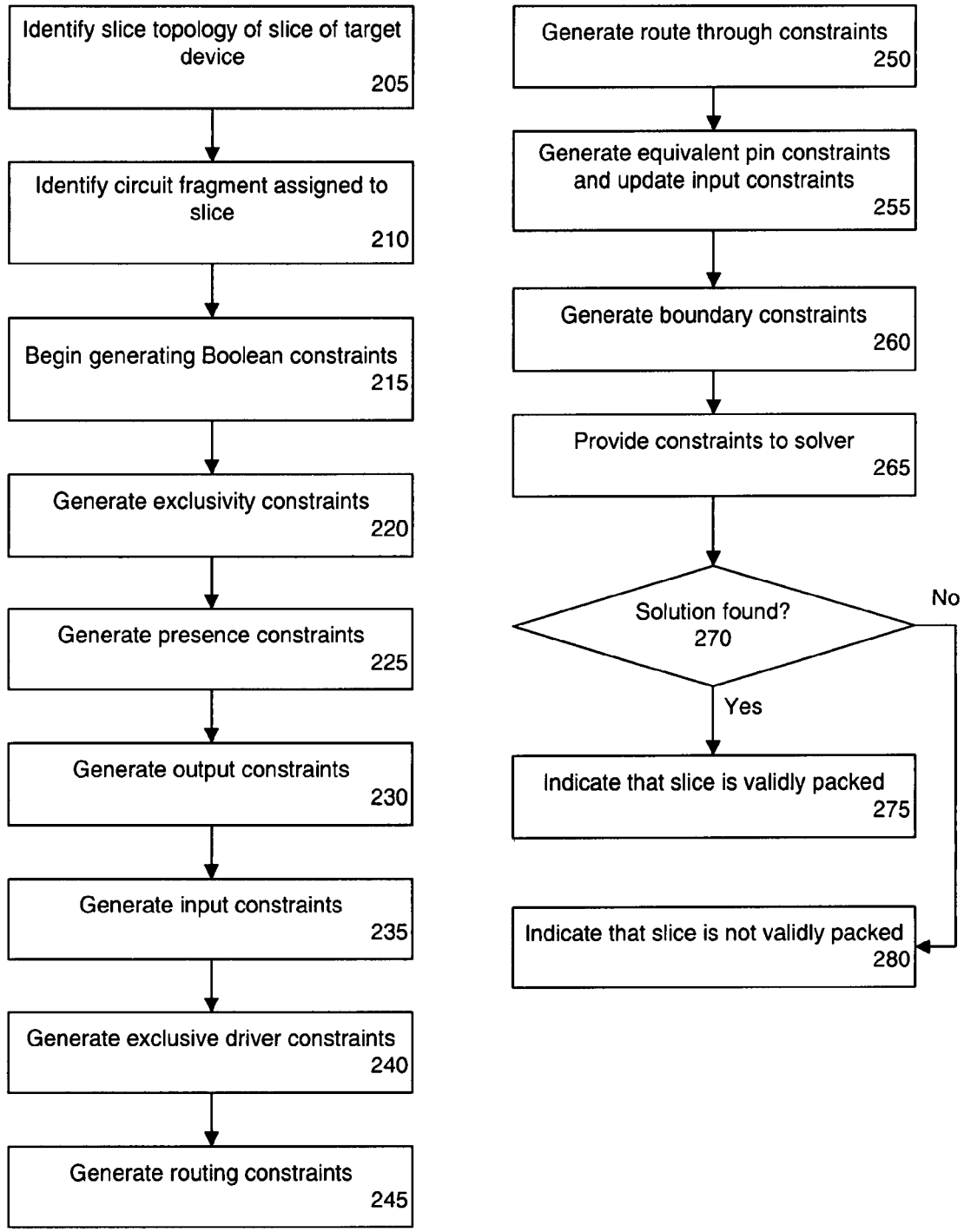
FIG. 2 is a flow chart illustrating a method of checking slice packing validity for a PLD in accordance with another embodiment of the present invention.

FIG. 2 is a flow chart illustrating a method 200 of checking slice packing validity for a PLD in accordance with another embodiment of the present invention. The method 200 can be implemented using a system such as the system described with reference to FIG. 1. Accordingly, the method 200 can begin in a state in which a set of circuit elements of a circuit fragment have been assigned to a slice of a target device having a known slice topology.

While the method 200 demonstrates a process for checking the validity of a single slice, it should be appreciated that the steps disclosed herein can be repeated as may be required to check packing validity of further slices. Reference to FIG. 1, along with the various circuit elements of the circuit fragment 120 and the circuit elements of the slice topology 115, will be made for purposes of illustration throughout the discussion of FIG. 2.

In step 205, a slice topology for a slice of a target device can be identified. In step 210, the circuit fragment that has been assigned to a slice conforming to the identified slice topology can be identified. In step 215, the constraint generator can begin to generate the Boolean constraints, or equations, that specify the conditions that must be observed in order to implement the circuit fragment within the slice.

In step 220, exclusivity constraints can be generated. Exclusivity constraints, in general, indicate that if a particular circuit element of the circuit fragment is mapped to a given location within the slice, that circuit element cannot also occupy another site or location within the slice. Exclusivity constraints also indicate that if a circuit fragment is mapped to a given location within the slice, then no other circuit fragment, or element of the circuit fragment, can be mapped to that location.

Referring to FIG. 1, consider that if the LUT X of the circuit fragment is mapped to LUT A within the slice, LUT X cannot also be located at LUT B within the slice. From this logical reality, the expression "(NOT X@A) OR (NOT X@B)" can be generated. The expression effectively states that "LUT X is either not located at LUT A or is not located at LUT B". That is, in the preceding expression, "X@A" is a Boolean variable which is true if LUT X of the circuit fragment is located at LUT A in the slice. Similarly, "X@B" is also a Boolean variable.

In further illustration, exclusivity constraints can be generated for the flip flop Z. The exclusivity constraints indicate the possible locations to which flip flop Z can be mapped or assigned within the slice. For example, the expression "(NOT Z@D) OR (NOT Z@E)" can be generated that indicates that flip flop Z is located at flip flop D or E within the slice.

Exclusivity constraints also can be generated specifying conditions for assigning, or mapping, routing resources of the circuit fragment to available nets of the slice. Boolean expressions can be generated for $U_i$@$N_j$ where i=[1, 2, ..., 7] and j=[1, 2, ..., 16]. For example, if signal $U_0$ is located at net $N_0$, signal $U_1$ cannot be located at $N_0$. This can be expressed as "(NOT $U_0$@$N_0$) OR (NOT $U_1$@$N_0$)". Exclusivity constraints can be defined for each of the circuit elements of the circuit fragment.

In step 225, presence constraints can be generated. Presence constraints stipulate that every element from the circuit fragment is mapped to at least one location in the slice. For example, as noted with reference to step 215, if LUT X is placed at LUT A in the slice, then LUT X cannot be located at LUT B in the slice. This can be expressed as "X@A OR X@B". This constraint, in conjunction with the exclusivity constraint, guarantees that LUT X will be placed at exactly one site, either at LUT A or LUT B within the slice.

Similarly, for flip flop Z, the expression "Z@D OR Z@E" can be generated. The combination of exclusivity and presence constraints, for example, indicates that flip flop Z can be located at either flip flop D or flip flop E of the slice and that the flip flop Z can be located at only one of those locations. Routing resources of the circuit fragment can be treated in the same fashion. Presence constraints can be generated for each of the elements of the circuit fragment.

In step 230, output constraints can be generated. Output constraints, in general, ensure that if a given component is placed at a particular location within the slice, a particular net of the slice must be associated with that component for output. In illustration, if LUT X of the circuit fragment is mapped to LUT A in the slice, the output of LUT X, which is $U_5$, must be mapped to the net labeled $N_{10}$ in the slice. This constraint can be expressed as "X@A→$U_5$@$N_{10}$". This expression, or constraint, ensures that if LUT X is placed at LUT A, the net $N_{10}$ carries the signal $U_5$. Output constraints can be generated for each of the components of the circuit fragment as appropriate.

In step 235, input constraints can be generated. Input constraints ensure that if a given component is mapped to a selected location in the slice, a particular net of the slice is used to provide the input signal to the component. For example, if LUT X of the circuit fragment is mapped to LUT A in the slice, the signal $U_0$ must be carried by net $N_0$. The constraint can be expressed as "$X@A \rightarrow U_0@N_0$". Further input constraints can be generated for the other input signals to LUT X as well as for the other components of the circuit fragment.

In step 240, exclusive driver constraints can be generated. Exclusive driver constraints determine which input will drive the output of a given multiplexer. Consider that multiplexer G can be driven by input 0 or input 1 in the slice. The determination of which input signal drives the output of multiplexer G is made by the configuration logic in the target device. The expression "$G_{0\text{-}out} \rightarrow (\text{NOT } G_{1\text{-}out})$" is an example of a driver constraint that indicates that if $G_0$ drives the output of the multiplexer G, then $G_1$ does not drive the output. Driver constraints can be imposed on each of the multiplexers for the slice to indicate the proper driver signal or net.

In step 245, routing constraints can be generated. The routing constraints can specify conditions that indicate, for example, if a net is present at an input to a routing multiplexer and the appropriate PIP is active, the output must have the correct net. For example, if the multiplexer G in the slice is driven by the 0 input and $U_5$ is assigned to $N_{10}$, then $U_5$ must be located at $N_{12}$ also. This constraint can be expressed as "$(G_{0\text{-}out} \text{ AND } U_5@N_{10}) \rightarrow U_5@N_{12}$". Further routing constraints can be defined or generated for multiplexers as needed.

In step 250, route-through constraints can be generated. Route-through constraints specify the possibility that some components can act as "route-throughs", or as routing resources. For example, in some cases a LUT can be programmed to pass one of its inputs out to an output and behave as a routing multiplexer. The ability to use components as "route-throughs" adds flexibility to the device.

In illustration, since the circuit fragment includes only one LUT, a possibility exists that LUT B will be used as a route-through. The term "$RT_B$" can be used to encode the choice as to whether LUT B in the slice will be used as a route-through. The expression "$(RT_B \text{ AND } B_{0\text{-}out}) \rightarrow (\text{NOT } B_{1\text{-}out})$" indicates that inputs 0 and 1 cannot drive the output of LUT B simultaneously. The expression "$(RT_B \text{ AND } B_{0\text{-}out} \text{ AND } U_8@N_5) \rightarrow (U_8@N_{11})$" can specify that if input 0 does drive the output of LUT B, and if net $U_5$ is mapped to input 0, that signal also would appear at the output. In other words, if LUT B is a route-through and is programmed such that the input 0 to LUT B also appears at the output, and if net $U_8$ appears at $N_5$, then the same net $U_8$ must also appear at $N_{11}$. Further constraints can be defined to specify conditions and relationships for other input pins and possible assignments to nets of the slice.

In step 255, equivalent pin constraints can be generated. In particular slice topologies, some logic pins are swappable. Consider the case where pins labeled 0 and 1 of LUT B are equivalent. A Boolean variable, $SWAP_B$ can be introduced that is true if the pins labeled 0 and 1 are swapped. The following two constraints can be provided to specify the input constraints for LUT B and net $N_5$: "$(SWAP_B \text{ AND } X@B) \rightarrow U_1@N_5$" and "$((\text{NOT } SWAP_B) \text{ AND } X@B) \rightarrow U_0@N_5$". The handling of equivalent input pins further affects the input constraints. Accordingly, the input constraints generated in step 235 can be modified or adjusted according to the equivalent pin constraints generated in step 255.

In step 260, boundary constraints can be generated. Boundary constraints specify conditions for assigning input and output signals of the circuit fragment to the input or output pins of the slice. An example of a boundary constraint can be "$U_6@N_{13} \text{ OR } U_6@N_{14} \text{ OR } U_6@N_{16}$", which states that the signal $U_6$ must be assigned to either $N_{13}$, $N_{14}$, or $N_{16}$. Further boundary constraints can be specified for the inputs and outputs of the circuit fragment.

In step 265, the constraints that were generated can be provided to the SAT-solver. The SAT-solver can determine whether all of the constraints can be satisfied simultaneously. If all of the constraints can be satisfied simultaneously, a valid place and route can be generated for the list of elements of the circuit fragment mapped to the slice elements. For example, if a solution is found that indicates that the expressions "$U_1@N_0, U_2@N_1, \ldots, X@A, RT_B, \ldots$" are true, then the signal $U_1$ of the circuit fragment is mapped to net $N_o$ of the slice; the LUT X of the circuit fragment is mapped to LUT A of the slice; and RTB indicates that LUT B of the slice is used as a route-through.

In step 270, a determination can be made as to whether a solution for all of the Boolean constraints exists. If so, the method can proceed to step 275, where an indication that the slice is validly packed can be provided. If no solution is found or exists, the method can proceed to step 280, where an indication can be provided that the slice was not validly packed. It should be appreciated that the output can be provided in the form of a report, for example, that specifies packing validity for one or more slices, in graphic form, or via a suitable audio indicator. Further, the functions described herein can be implemented within a larger synthesis tool or made available in standalone form.

In another aspect, the embodiments described herein can be optimized for faster execution. In cases where unrelated logic is packed with a slice, for example when the total number of slices needed for a circuit design exceeds the available slices in the target device, sets of constraints for each of the slices can be cached. Additional constraints can be added that relate to the union of the circuit fragments being combined into a same slice. Other constraints, such as constraints relating to signals that may have become internal nets within the combined slice, can be removed.

The embodiments described herein provide a technique for checking for valid slice packing without the necessity of developing custom coded solutions for differing slice architectures. By generating Boolean constraints according to a circuit fragment to be assigned to a slice and a known slice topology, the need for custom coded solutions can be avoided. A SAT-solver can be used to determine if the slice packing is valid based upon whether a solution to the Boolean constraints is found.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, or one or more portions of a wired or wireless network through which computer-usable program code can be propagated, or the like.

The terms "computer program", "software", "application", computer-usable program code, variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e. open language.

This invention can be embodied in other forms without departing from the spirit or essential attributes thereof. Accordingly, reference should be made to the following claims, rather than to the foregoing specification, as indicating the scope of the invention.

What is claimed is:

1. A method of determining validity of slice packing for a programmable device comprising:
    identifying a slice topology for a slice of the programmable device, wherein the slice topology specifies available circuit elements within the slice;
    identifying a circuit fragment assigned to the slice;
    generating, from the circuit fragment and the slice topology, a set of Boolean equations describing placement constraints that must be met to map circuit elements of the circuit fragment to available circuit elements of the slice;
    determining, using a satisfiability solver, whether a solution comprising a set of values to the set of Boolean equations exists in which the set of Boolean equations evaluate to true; and
    using a computer, indicating whether the slice is validly packed according to whether the solution for the set of Boolean equations is determined.

2. The method of claim 1, wherein indicating whether the slice is validly packed further comprises indicating that the slice is validly packed if a solution for the set of Boolean equations is determined.

3. The method of claim 1, wherein generating a set of Boolean equations further comprises:
    defining exclusivity constraints for mapping circuit elements of the circuit fragment to circuit elements of the slice, wherein each exclusivity constraint specifies that a selected circuit element of the circuit fragment is located at only one circuit element of the slice; and
    defining presence constraints for mapping circuit elements of the circuit fragment to circuit elements of the slice, wherein the presence constraints specify that each circuit element of the circuit fragment is mapped to at least one circuit element of the slice.

4. The method of claim 1, wherein generating a set of Boolean equations further comprises defining constraints specifying that when a component of the circuit fragment is assigned to a selected circuit element of the slice, an output of the component is assigned to a net that is an output of the selected circuit element.

5. The method of claim 1, wherein generating a set of Boolean equations further comprises defining constraints specifying that when a component of the circuit fragment is assigned to a selected circuit element of the slice, an input of the component is assigned to a net that is an input to the selected circuit element.

6. The method of claim 1, wherein generating a set of Boolean equations further comprises defining at least one constraint specifying which of a plurality of inputs drives an output of a circuit element of the slice and that only one of the plurality of inputs drives the output exclusively.

7. The method of claim 1, wherein generating a set of Boolean equations further comprises defining routing constraints for circuit elements of the circuit fragment and circuit elements of the slice.

8. The method of claim 1, wherein generating a set of Boolean equations further comprises defining at least one route-through constraint for at least one circuit element of the slice, wherein the at least one route-through constraint specifies that the at least one circuit element functions as a routing multiplexer passing a selected input signal through as an output signal.

9. The method of claim 1, wherein generating a set of Boolean equations further comprises defining at least one equivalent pin constraint for swappable pins of the slice, wherein the at least one equivalent pin constraint comprises a Boolean variable that evaluates to true when pins represented by the variable are equivalent and swapped.

10. The method of claim 1, wherein generating a set of Boolean equations further comprises defining at least one constraint for assigning input signals and output signals of the circuit fragment to nets of the slice.

11. A method of determining validity of slice packing for a programmable device comprising:
    identifying a slice topology for a slice of the programmable device and a plurality of circuit elements assigned to the slice;

generating a set of Boolean constraints that specifies placement constraints and enforces the slice topology when mapping the plurality of circuit elements to the slice;

determining, using a satisfiability solver, whether a solution comprising a set of values to the set of Boolean constraints exists in which the set of Boolean constraints evaluate to true; and using a computer, indicating whether the slice is validly packed according to whether the solution is found for the set of Boolean constraints, wherein indicating whether the slice is validly packed further comprises indicating that the slice is validly packed if the solution to the set of Boolean constraints is determined.

12. A computer program product comprising:

a non-transitory computer-usable storage medium having computer-usable program code that determines validity of slice packing for a programmable device, said computer program product including:

computer-usable program code that identifies a slice topology for a slice of the programmable device, wherein the slice topology specifies available circuit elements within the slice;

computer-usable program code that identifies a circuit fragment assigned to the slice;

computer-usable program code that generates, from the circuit fragment and the slice topology, a set of Boolean equations describing placement constraints that must be met to map circuit elements of the circuit fragment to available circuit elements of the slice;

computer-usable program code that determines whether a solution to the set of Boolean equations exists in which the set of Boolean equations evaluate to true; and computer-usable program code that indicates whether the slice is validly packed according to whether the solution for the set of Boolean equations is determined.

13. The computer program product of claim 12, wherein the computer-usable program code that indicates whether the slice is validly packed further comprises computer-usable program code that indicates that the slice is validly packed if a solution for the set of Boolean equations is determined.

14. The computer program product of claim 12, wherein the computer-usable program code that generates a set of Boolean equations further comprises:

computer-usable program code that defines exclusivity constraints for mapping circuit elements of the circuit fragment to circuit elements of the slice, wherein each exclusivity constraint specifies that a selected circuit element of the circuit fragment is located at only one circuit element of the slice; and computer-usable program code that defines presence constraints for mapping circuit elements of the circuit fragment to circuit elements of the slice, wherein the presence constraints specify that each circuit element of the circuit fragment is mapped to at least one circuit element of the slice.

15. The computer program product of claim 12, wherein the computer-usable program code that generates a set of Boolean equations further comprises:

computer-usable program code that defines constraints specifying that when a component of the circuit fragment is assigned to a selected circuit element of the slice, an output of the component is assigned to a net that is an output of the selected circuit element; and computer-usable program code that defines constraints specifying that when a component of the circuit fragment is assigned to a selected circuit element of the slice, an input of the component is assigned to a net that is an input to the selected circuit element.

16. The computer program product of claim 12, wherein the computer-usable program code that generates a set of Boolean equations further comprises at least one of:

computer-usable program code that defines at least one constraint specifying which of a plurality of inputs drives an output of a circuit element of the slice and that only one of the plurality of inputs drives the output exclusively; and computer-usable program code that defines routing constraints for circuit elements of the circuit fragment and circuit elements of the slice.

17. The computer program product of claim 12, wherein the computer-usable program code that generates a set of Boolean equations further comprises computer-usable program code that defines at least one route-through constraint for at least one circuit element of the slice, wherein the at least one route-through constraint specifies that the at least one circuit element functions as a routing multiplexer passing a selected input signal through as an output signal.

18. The computer program product of claim 12, wherein the computer-usable program code that generates a set of Boolean equations further comprises computer-usable program code that defines at least one equivalent pin constraint for swappable pins of the slice, wherein the at least one equivalent pin constraint comprises a Boolean variable that evaluates to true when pins represented by the variable are equivalent and swapped.

19. The computer program product of claim 12, wherein the computer-usable program code that generates a set of Boolean equations further comprises computer-usable program code that defines at least one constraint for assigning input signals and output signals of the circuit fragment to nets of the slice.

* * * * *